United States Patent [19]

Nagano

[11] Patent Number: 4,479,086
[45] Date of Patent: Oct. 23, 1984

[54] TRANSISTOR CIRCUIT

[75] Inventor: Katsumi Nagano, Shimonoseki, Japan

[73] Assignee: Tokyo Shibaura Denki Kabushiki Kaisha, Japan

[21] Appl. No.: 422,097

[22] Filed: Sep. 23, 1982

[30] Foreign Application Priority Data

Sep. 24, 1981 [JP] Japan ............... 56-151273
Oct. 30, 1981 [JP] Japan ............... 56-173775

[51] Int. Cl.$^3$ .................................... G05F 3/16
[52] U.S. Cl. ............................ 323/315; 323/268; 307/261; 307/296 R
[58] Field of Search ............ 323/312, 315–316, 323/268–270; 307/260, 261, 296 R, 297

[56] References Cited

U.S. PATENT DOCUMENTS 3,868,581  2/1975  Ahmed ................. 323/315 X
4,166,971  9/1979  Schneider ............ 323/315

FOREIGN PATENT DOCUMENTS 2459360  7/1975  Fed. Rep. of Germany ...... 323/315

OTHER PUBLICATIONS

"Precision Differential Voltage–Current Converter," Electronics Letters, vol. 9, No. 6, pp. 147–148, (1973).

Primary Examiner—Peter S. Wong
Attorney, Agent, or Firm—Finnegan, Henderson, Farabow, Garrett & Dunner

[57] ABSTRACT

A transistor circuit, in which three transistors have their collector-emitter paths connected in series with respective current paths. The transistor in each current path has its base connected to the collector of the like position transistor in the subsequent current path. In this circuit, the voltages between the opposite terminals of the individual current paths are equal to one another irrespective of currents flowing through the current paths.

11 Claims, 32 Drawing Figures

F I G. 3
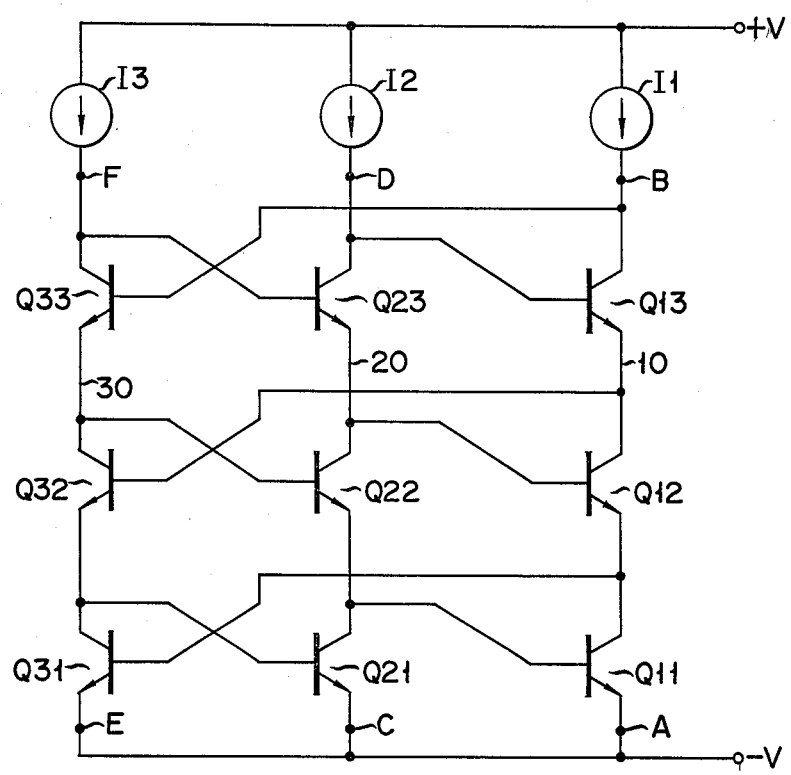
F I G. 4
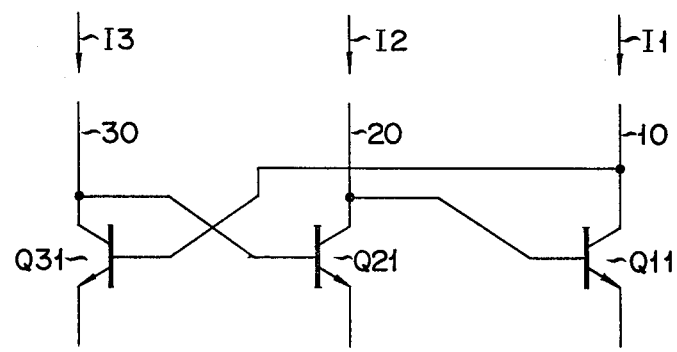

TRANSISTOR CIRCUIT

BACKGROUND OF THE INVENTION

This invention relates to transistor circuits.

Transistor circuits having a cross-coupled pair of transistors have been utilized in various circuits. The cross-coupled pair of transistors are two transistors with the base of each transistor connected to the collector of the other. The transistor circuit is a circuit, in which the collector-emitter paths of the individual transistors in the cross-coupled pair are connected in series with respective current paths. This transistor circuit has a feature that if the two transistors have an equal emitter area, the collector-emitter voltages of the two transistors are equal irrespective of the currents flowing through the current paths. This feature is made use of in the application of the transistor circuit to voltage-current converters and current sources. However, the prior art transistor circuit has only two current paths, and therefore its applications are limited.

SUMMARY OF THE INVENTION

An object of the invention is to provide a transistor circuit, which has at least three current paths and an equal voltage is produced across a predetermined section of the individual current paths.

The above object of the invention is attained by a transistor circuit, which comprises at least three current paths, and at least three transistors with the collector-emitter paths thereof connected in series with the respective current paths, with the base of the i-th transistor (i being a positive integer up to N-1, N being the number of current paths) connected to the collector of the (i+1)-th transistor and the base of the N-th transistor connected to the collector of the first transistor.

BRIEF DESCRIPTION OF THE DRAWINGS

FIG. 3 is a circuit diagram showing an example of an application of the same embodiment;

FIGS. 4 to 7 are circuit diagrams showing second to fifth embodiments of the invention;

DETAILED DESCRIPTION OF THE PREFERRED EMBODIMENTS

Now, preferred embodiments of the transistor circuit according to the invention will be described with reference to the drawings. In the following description, the number of current paths included in the transistor circuit is referred to as the order of the circuit.

Figure 1:
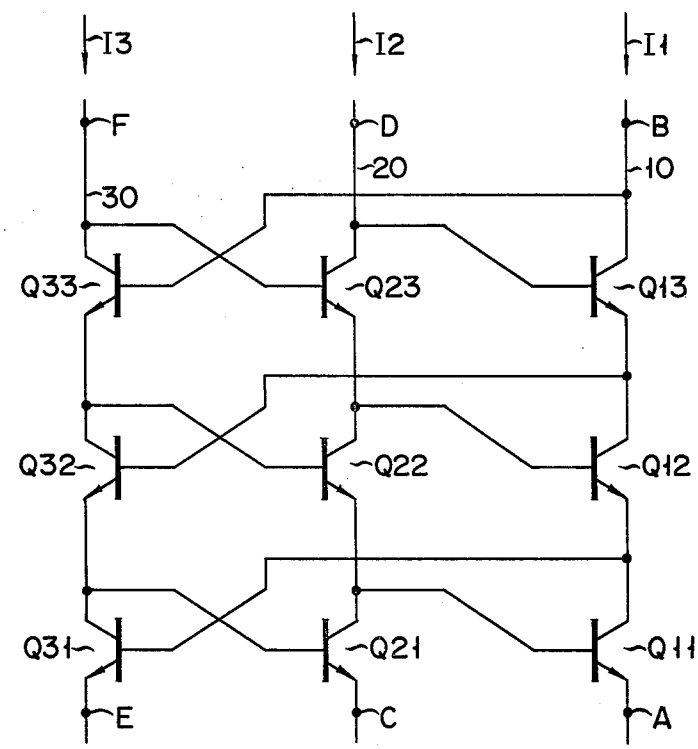
FIG. 1 is a circuit diagram showing a first embodiment of the transistor circuit according to the invention.

FIG. 1 shows a third-order transistor circuit embodying the invention. This embodiment comprises three current paths and nine transistors, three serially connected in each of the current paths. In the following description, the transistors are assumed to be npn type BJTs. Transistors Q11, Q12 and Q13 have their collector-emitter paths serially connected in a current path 10, transistors Q21, Q22 and Q23 have their collector-emitter paths serially connected in a current path 20, and transistors Q31, Q32 and Q33 have their collector-emitter paths serially connected in a current path 30. The transistors Q11, Q21 and Q31, transistors Q12, Q22 and Q32 and transistors Q13, Q23 and Q33 constitute respective sequentially-coupled groups which constitute a gist of the invention. In the sequentially-coupled group of transistors Q11, Q21 and Q31, the base of the transistor Q11 is connected to the collector of the transistor Q21, the base of the transistor Q21 is connected to the collector of the transistor Q31, and the base of the transistor Q31 is connected to the collector of the transistor Q11. The other sequentially-coupled groups of transistors Q12, Q22 and Q32 and transistors Q13, Q23 and Q33 are similarly connected.

The operation of this embodiment will now be described. The currents flowing through the current paths 10, 20 and 30 are respectively denoted I1, I2 and I3. The opposite terminals of the current path 10 are designated at A and B, the opposite terminals of the current path 20 are designated at C and D, and the opposite terminals of the current path 30 are designated at E and F. If the common-emitter current amplification factor of each of the transistors Q11 to Q13, Q21 to Q23 and Q31 to Q33 is sufficiently large, the collector currents of the transistors Q11 to Q13 are all I1, the collector currents of the transistors Q21 to Q23 are all I2, and the collector currents of the transistors Q31 to Q33 are all I3. Generally, the collector current IC of a transistor and the base-emitter voltage VBE thereon are related as $$VBE = VT \cdot \ln \frac{IC}{IS} \qquad (1)$$

where VT is the electronvolts equivalent to the temperature and equal to kT/e and IS is the reverse saturation current.

If all the transistors in FIG. 1 have an equal area, the voltages between the opposite terminals of the individual current paths are given as $$VAB = VBE(11) + VBE(22) + VBE(33) \qquad (2)$$

$$= VT \cdot \ln \frac{I1 \cdot I2 \cdot I3}{IS \cdot IS \cdot IS}$$

$$VCD = VBE(21) + VBE(32) + VBE(13) \qquad (3)$$

-continued $$= VT \cdot \ln \frac{I1 \cdot I2 \cdot I3}{IS \cdot IS \cdot IS}$$

and $$VEF = VBE(31) + VBE(12) + VBE(23) \quad (4)$$

$$= VT \cdot \ln \frac{I1 \cdot I2 \cdot I3}{IS \cdot IS \cdot IS}$$

From the equations (2) to (4), it will be seen that the voltages between the opposite terminals of the individual current paths have the same value of $$VT \cdot \ln \frac{I1 \cdot I2 \cdot I3}{IS \cdot IS \cdot IS}$$

irrespective of the currents through the current paths. This means that the circuit of FIG. 1 can be applied to a level shift circuit or a voltage follower circuit, in which the levels at the points A, C and E are shifted to the points B, D and F or vice versa.

Now, the conditions under which the present embodiment can operate normally will be discussed. The voltage at the point A is assumed to be zero, and this point A is taken as a reference point. The voltages at the points C and E are referred to as $\Delta V1$ and $\Delta V2$ respectively, and the base-emitter voltages VBE on the individual transistors are assumed to be equal. The conditions under which this transistor circuit can operate normally are such that the individual transistors can operate normally. Since the transistors are all npn type transistors, they can operate normally if their collector-emitter voltage VCE (i.e., VC-VE) is positive. The collector-emitter voltages VCE on the individual transistors are given as $$VCE(11) = \Delta V2 + VBE \quad (5)$$

$$VCE(21) = -\Delta V1 + VBE \quad (6)$$

$$VCE(31) = \Delta V1 - \Delta V2 + VBE \quad (7)$$

$$VCE(12) = \Delta V1 - \Delta V2 + VBE \quad (8)$$

$$VCE(22) = \Delta V2 + VBE \quad (9)$$

$$VCE(32) = -\Delta V1 + VBE \quad (10)$$

$$VCE(13) = -\Delta V1 + VBE \quad (11)$$

$$VCE(23) = \Delta V1 - \Delta V2 + VBE \quad (12)$$

and $$VCE(33) = \Delta V2 + VBE \quad (13)$$

The equations (5) to (13) are all positive if the following conditions are met.

$$\Delta V1 < VBE \quad (14)$$

$$\Delta V2 > -VBE \quad (15)$$

and $$\Delta V1 - \Delta V2 > -VBE \quad (16)$$

Figure 2:
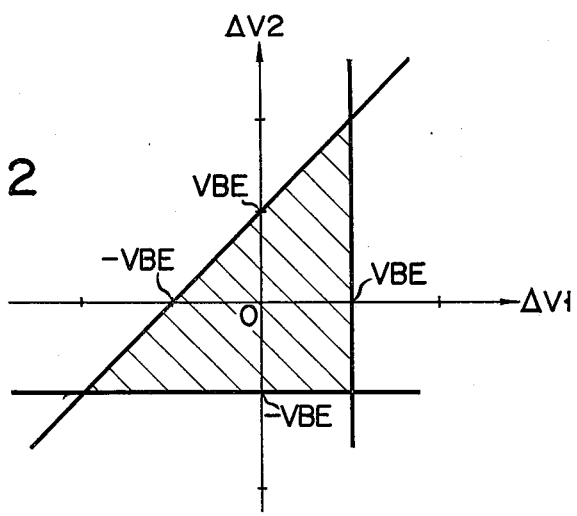
FIG. 2 is a graph showing the operating range of the same embodiment.

These three conditions are the conditions under which the transistor circuit can operate normally. FIG. 2 illustrates the operating conditions of the equations (14) to (16). In FIG. 2, the ordinate is taken for $\Delta V2$, and the abscissa is taken for $\Delta V1$. The shaded area represents the operating range of the circuit. It will be seen from these operating conditions that the circuit of FIG. 1 can be operated as a small signal circuit having small signal sources such as $\Delta V1$ and $\Delta V2$ within the shaded area.

In the description so far, the transistors have been assumed to have an equal emitter area. Now, the case where the transistors have different emitter areas will be discussed. The emitter areas of the transistors Q11 to Q13 are denoted as A11 to A13, the emitter areas of the transistors Q21 to Q23 as A21 to A23, and the emitter areas of the transistors Q31 to Q33 as A31 to A33. Assuming the potential on one terminal A, C and E of the three current paths 10, 20 and 30 to be zero, the potential differences VBD, VDF and VFB between the other terminals B and D, D and F, and F and B respectively, are given as $$VBD = VBE(11) + VBE(22) + VBE(33) - \quad (17)$$
$$VBE(21) - VBE(32) - VBE(13)$$

$$= VT \cdot \ln \frac{A21 \cdot A32 \cdot A13}{A11 \cdot A22 \cdot A33}$$

$$VDF = VBE(21) + VBE(32) + VBE(13) - \quad (18)$$
$$VBE(31) - VBE(12) - VBE(23)$$

$$= VT \cdot \ln \frac{A31 \cdot A12 \cdot A23}{A21 \cdot A32 \cdot A13}$$

and $$VBF = VBE(31) + VBE(12) + VBE(23) - \quad (19)$$
$$VBE(11) - VBE(22) - VBE(33)$$

$$= VT \cdot \ln \frac{A11 \cdot A22 \cdot A33}{A12 \cdot A23 \cdot A31}$$

From the equations (17) to (19), it will be seen that the voltage differences between the other terminals of the current paths are independent of the currents I1 to I3 but are determined by the ratios of emitter areas of transistors. If the emitter areas of all the transistors are assumed to be equal, the voltage differences o the equations (17) to (19) are all zero, and this coincides with the previous description. This circuit is accordingly applied to a circuit for generating a voltage proportional to the temperature.

FIG. 3 shows a circuit diagram of a specific example of an application of the above embodiment. Here, the points A, C and E in the circuit of FIG. 1 are connected to a negative voltage source terminal $-V$, and the points B, D and F are connected to a positive voltage source terminal $+V$ through respective current sources I1 to I3. If the emitter areas of the transistors in this circuit are all equal, the voltages at the points B, D and F are equal to one another irrespective of the voltage source. Thus circuit thus can act as a constant voltage circuit.

FIG. 4 shows a circuit diagram of a second embodiment of the invention. This circuit is the simplest example of the third order transistor circuit, that is, it consists of a single sequentially-coupled group of transistors Q11, Q21 and Q31.

Figure 5:
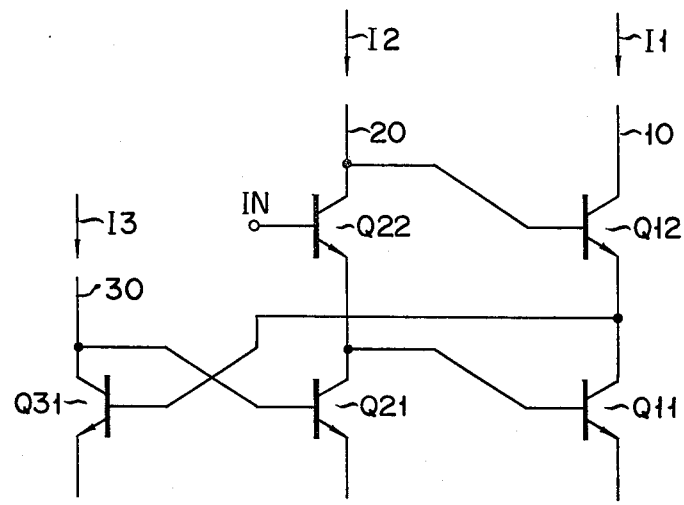

FIG. 5 shows a circuit diagram of a third embodiment of the invention. This circuit is obtained by omitting the transistors Q13, Q23, Q32 and Q33 from the first embodiment of FIG. 1 and connecting the base of the transistor Q22 to an input signal source IN.

Figure 6:
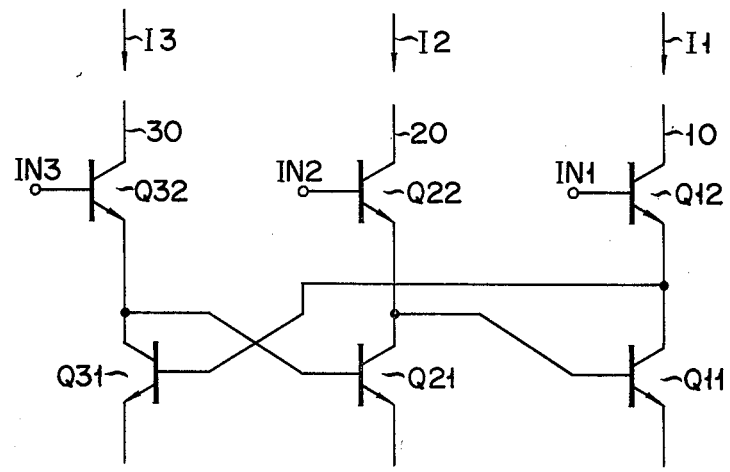

FIG. 6 shows a circuit diagram of a fourth embodiment of the invention. This circuit is obtained by omitting the transistors Q13, Q23 and Q33 in the first embodiment. Here, the transistors Q12, Q22 and Q32 are not connected to form a sequentially-coupled group, but their bases are connected to respective input signal sources IN1 to IN3.

Figure 7:
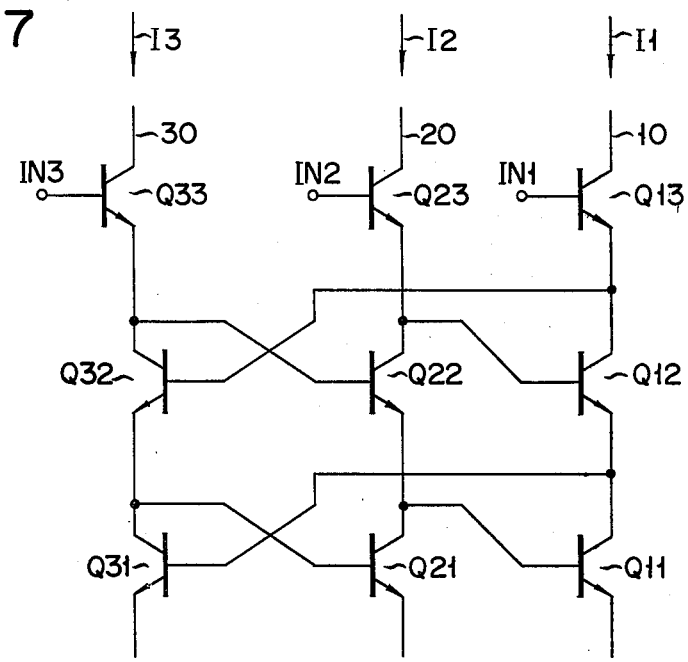

FIG. 7 shows a circuit diagram of a fifth embodiment of the invention. This circuit, like the circuit of the first embodiment, comprises nine transistors. This circuit is different from the first embodiment in that the transistors Q13, Q23 and Q33 are not connected to form a sequentially-coupled group but their bases are connected to respective input signal sources IN1 to IN3.

In the fourth and fith embodiments, there exist the voltage relations as discussed before between the terminals A, C and E of the current paths and the input signal terminals IN1 to IN3.

Figure 8:
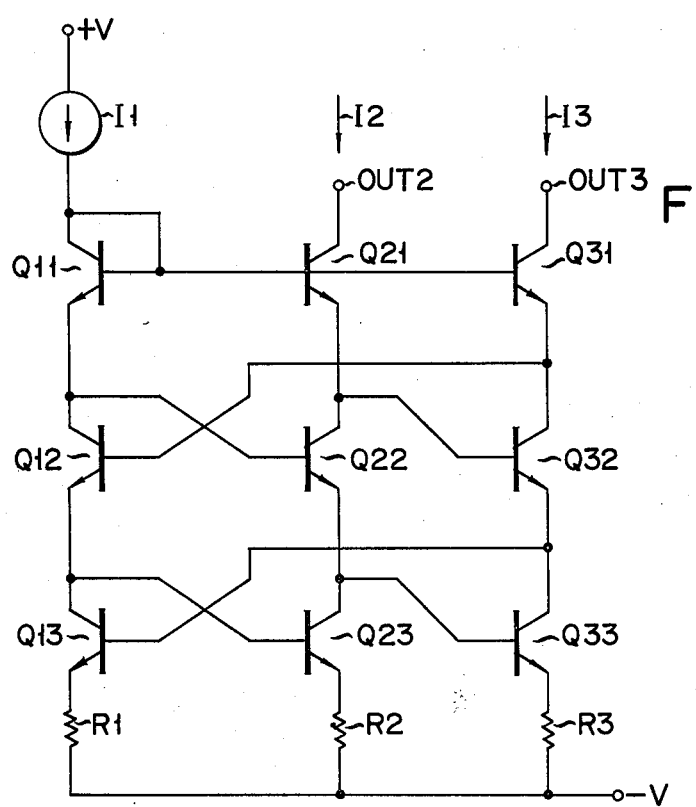
FIG. 8 is a circuit diagram showing a current source circuit as the sixth embodiment of the invention.

FIG. 8 shows a circuit diagram of a sixth embodiment of the invention. This circuit is a current source circuit which can provide two output currents. The transistors Q11, Q21 and Q31 have their bases commonly connected, and the common junction is connected to the collector of the transistor Q11. These transistors thus form a current mirror circuit. The emitter of the transistor +V through a current source I1. The emitter of the transistor Q11 is connected to a negative voltage source terminal −V through the collector-emitter paths of the transistors Q12 and Q13 and a resistor R1 in series with one another. The transistor Q21 has the collector connected to an output terminal OUT2 and the emitter connected to the negative voltage source terminal −V through the collector-emitter paths of the transistors Q22 and Q23 and a resistor R2 in series with one another. The transistor Q31 has the collector connected to an output terminal OUT3 and the emitter connected to the nagative voltage source terminal −V through the collector-emitter paths of the transistors Q32 and Q33 and a resistor R3 in series with one another. The transistors Q12, Q22 and Q32 constitute a sequentially-coupled group. That is, the base of the transistor Q12 is connected to the collector of the transistor Q32, the base of the transistor Q32 is connected to the collector of the transistor Q22, and the base of the transistor Q22 is connected to the collector of the transistor Q12. The transistors Q13, Q23 and Q33 similarly constitute a sequentially-coupled group.

The operation of this embodiment will now be described. Like the case of the previous embodiment, it is assumed that the transistors have an equal emitter area, and their emitter-grounded current amplification factor is sufficiently high. The current flowing through the transistors Q11 to Q13 and resistor R1 is denoted by I1, the current flowing from the output terminal OUT2 through the transistors Q21 to Q23 and resistor R2 is denoted by I2, and the current flowing from the output terminal OUT3 through the transistors Q31 to Q33 and resistor R3 is denoted by I3. Since the base voltages on the transistors Q11, Q21 and Q31 are equal, their relations are given as $$I1 \cdot R1 + V_{BE}(13) + V_{BE}(12) + V_{BE}(11) = \qquad (20)$$

$$I2 \cdot R2 + V_{BE}(23) + V_{BE}(22) + V_{BE}(21) =$$

$$I3 \cdot R3 + V_{BE}(33) + V_{BE}(32) + V_{BE}(31)$$

$$V_{BE}(11) = V_{BE}(12) = V_{BE}(13) \qquad (21)$$

$$V_{BE}(21) = V_{BE}(22) = V_{BE}(23) \qquad (22)$$

and $$V_{BE}(31) = V_{BE}(32) = V_{BE}(33) \qquad (23)$$

Substituting the equations (21) to (23) into the equation (20), the following result is obtained $$I1 \cdot R1 = I2 \cdot R2 = I3 \cdot R3 \qquad (24)$$

Thus, the currents I2 and I3 can be given as $$I2 = \frac{R1}{R2} I1 \qquad (25)$$

and $$I3 = \frac{R1}{R3} I1 \qquad (26)$$

It will be understood that in this embodiment the output currents I2 and I3 are determined by the input current I1 and ratios of resistances. Thus, two output currents of different values can be readily obtained by selecting different resistance values.

Figure 9:
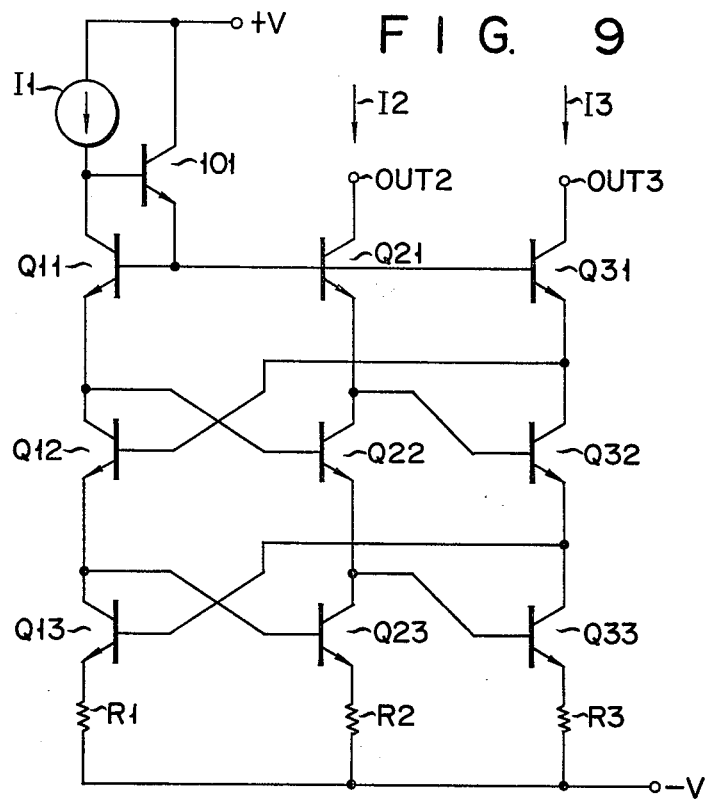
FIG. 9 is a circuit diagram showing a circuit used for experiments for analyzing the characteristics of the sixth embodiment.
Figure 10:
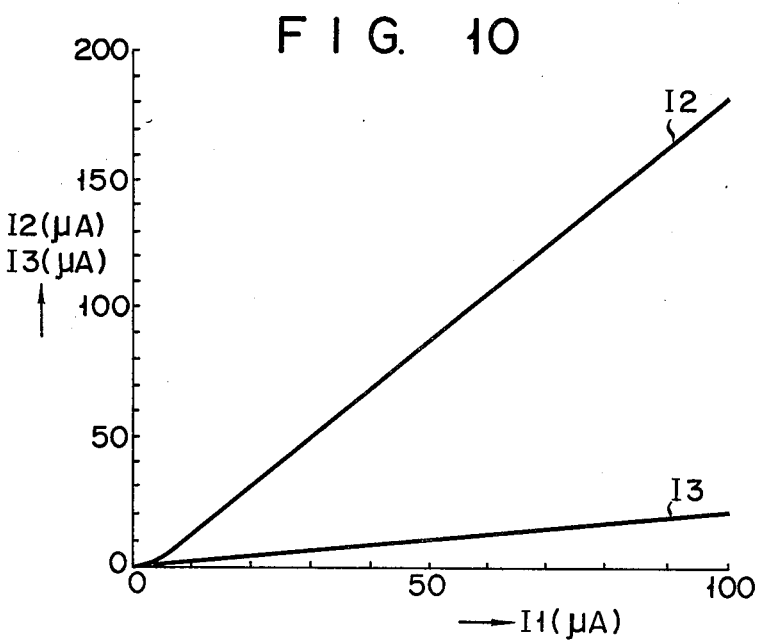
FIGS. 10 to 13 are graphs showing the characteristics of the circuit of the sixth embodiment.
Figure 11:
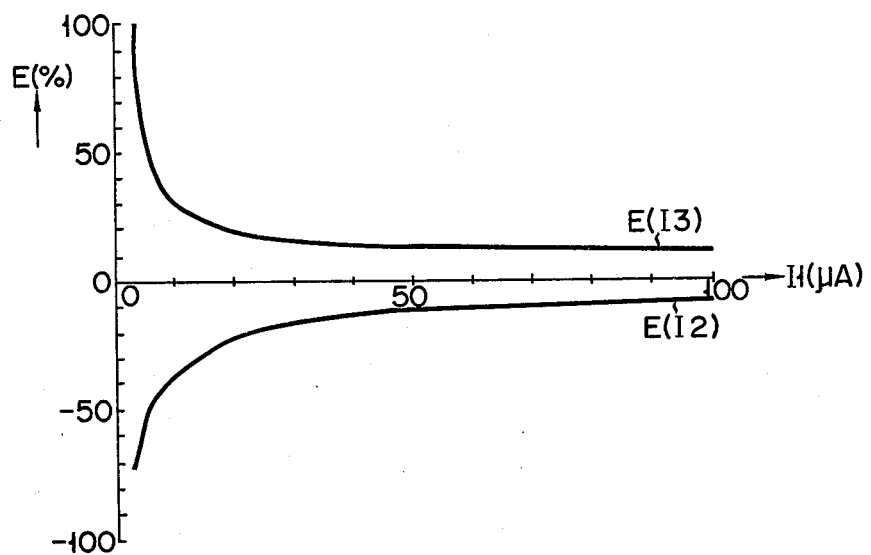
Figure 12:
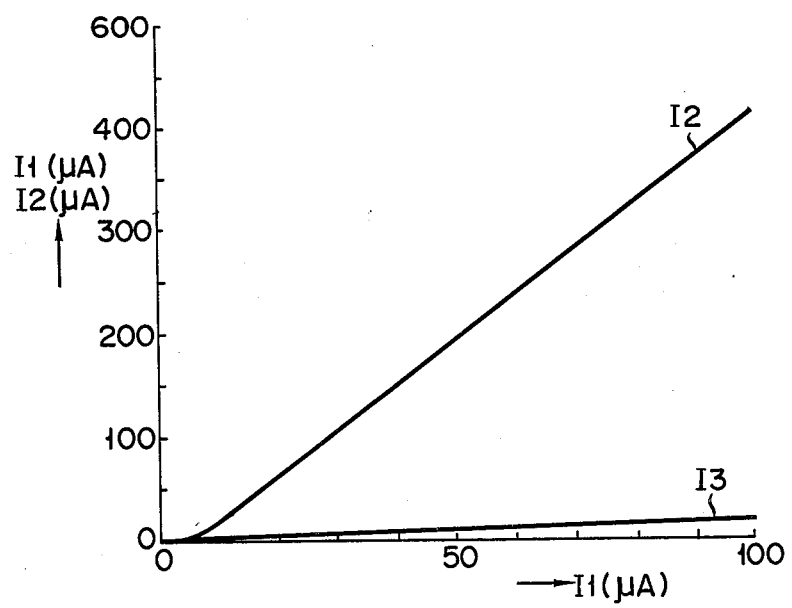
Figure 13:
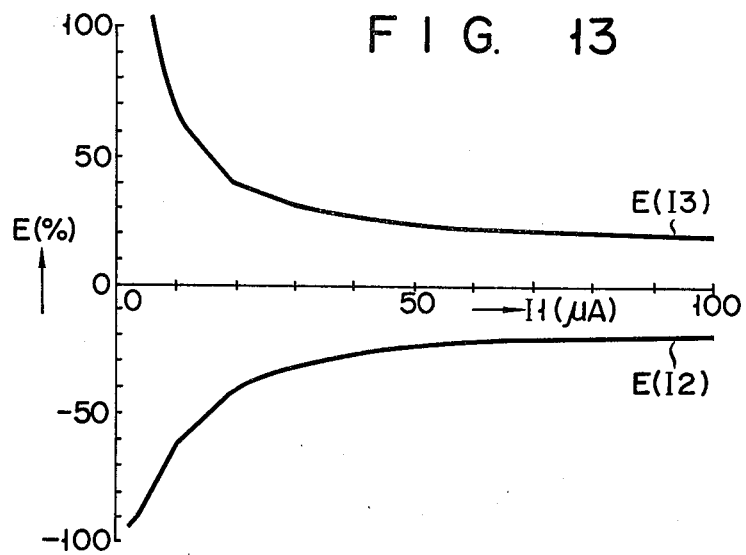

The operation characteristics of this current source circuit will now be analyzed. FIG. 9 shows a circuit which was used for experiments. This experimental circuit is different from the circuit of FIG. 8 in that the base of the transistor Q11 is connected to the collector thereof not directly, but through the emitter-base path of a current amplification transistor 101. The collector of the transistor 101 is connected to the positive voltage source terminal +V. FIG. 10 shows the output currents I2 and I3 plotted against the input current I1. These output currents are obtained by setting the resistances in FIG. 9 to R1=1kΩ, R2=500Ω and R3=5kΩ. FIG. 11 shows percentage error voltages E (I2) and E (I3) included in I2 and I3 shown in FIG. 10. The percentage error voltage (%) is the quotient of the experimental value minus the calculated value, by the calculated value, multiplied by 100. FIG. 12 shows the output currents I2 and I3 plotted against the input current I1 in case when the resistances in FIG. 9 are set as R1=1kΩ, R2=200Ω and R3=10kΩ. FIG. 13 shows the percentage error voltage E (I2) and E (I3) included in I2 and I3 shown in FIG. 13. In the first experiment, the current amplification factors for the output currents I2 and I3 with respect to the input current I1 are respectively 2 and 0.2, and in the second embodiment they are respectively 5 and 0.1. It will be seen that the percentage errors may be held within approximately 10% with the conditions as set in the first experiment and within approximately 20% with the conditions as set in the second experiment if the input current I1 is set to be sufficiently large. The transistor 101 in the experimental circuit of FIG. 9, serves to minimize the errors. That is, while in the circuit of FIG. 8 part of the input current I1 is supplied to the bases of the transistors Q11, Q21 and Q31, in the circuit of FIG. 9 the input current I1 is supplied to the base of the transistor 101.

Figure 14:
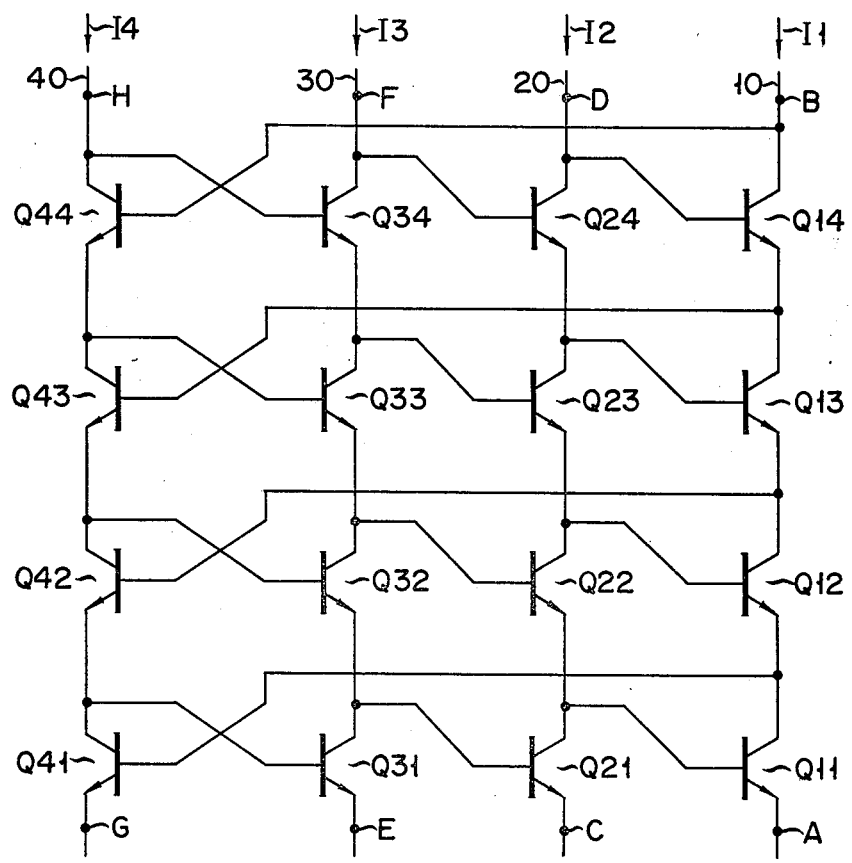
FIG. 14 is a circuit diagram showing a seventh embodiment of the transistor circuit according to the invention.
Figure 15A:
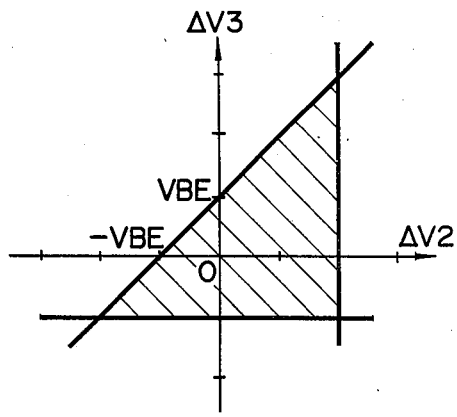
FIGS. 15A to 15E are graphs showing operating ranges of the seventh embodiment under various conditions.
Figure 15B:
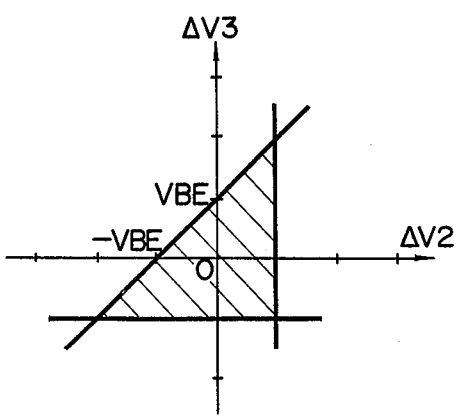
Figure 15C:
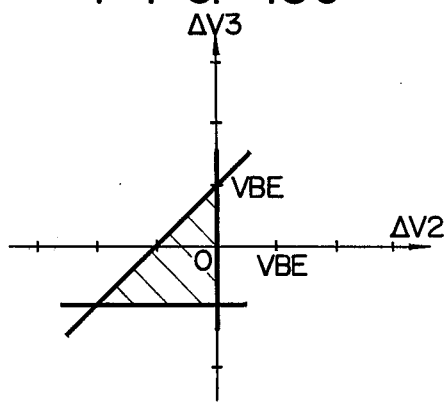
Figure 15D:
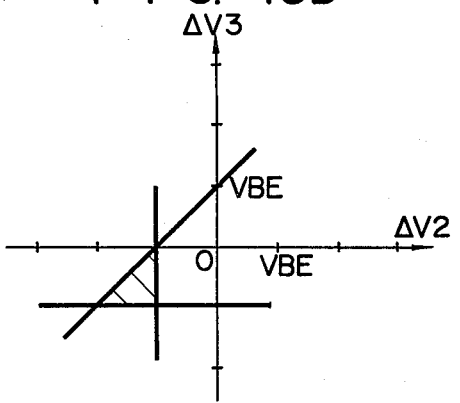
Figure 15E:
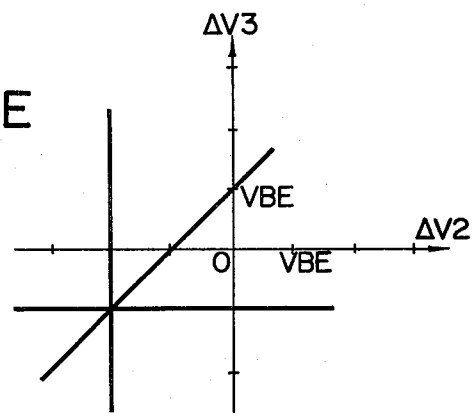

FIG. 14 shows a seventh embodiment of the invention. While the preceding first to sixth embodiments have been concerned with third order transistor circuits, the seventh embodiment concerns a fourth order transistor circuit. That is, the circuit comprises four current paths 10, 20, 30 and 40 and sixteen transistors, four having the collector-emitter paths connected in series with each of the current paths. The four transistors in like positions of the respective current paths constitute a sequentially-coupled group, that is, the transistors Q11 to Q41, transistors Q12 to Q42, transistors Q13 to Q43 and transistors Q14 to Q44 constitute respective sequentially-coupled groups.

In this construction, if the transistors all have an equal emitter area, like the three order case described before, there hold relations $$VBA = VBE(11) + VBE(22) + VBE(33) + VBE(44) \quad (27)$$

$$VDC = VBE(21) + VBE(32) + VBE(43) + VBE(14) \quad (28)$$

$$VFE = VBE(31) + VBE(42) + VBE(13) + VBE(24) \quad (29)$$

and $$VHG = VBE(41) + VBE(12) + VBE(23) + VBE(34) \quad (30)$$

Substituting the equation (1) into the equations (27) to (30), the following relationship is obtained:

$$VBA = VDC = VFE = VHG = VT \cdot \ln \frac{I1 \cdot I2 \cdot I3 \cdot I4}{IS \cdot IS \cdot IS \cdot IS} \quad (31)$$

It will be seen that with this fourth order transistor circuit, the voltages between the opposite terminals of the individual current paths again can be set to be equal irrespective of the currents flowing through the current paths.

The conditions under which the circuit can operate normally, will now be analyzed similar to the third order circuit case. Setting the voltage at the point A to be zero and denoting the voltages on the points C, E and G by $\Delta V1$, $\Delta V2$ and $\Delta V3$ respectively, the collector-emitter voltage on the individual transistors are given as $$VCE(11) = \Delta V3 + VBE \quad (32)$$

$$VCE(21) = -\Delta V1 + VBE \quad (33)$$

$$VCE(31) = \Delta V1 - \Delta V2 + VBE \quad (34)$$

$$VCE(41) = \Delta V2 - \Delta V3 + VBE \quad (35)$$

$$VCE(12) = \Delta V2 - \Delta V3 + VBE \quad (36)$$

$$VCE(22) = \Delta V3 + VBE \quad (37)$$

$$VCE(32) = -\Delta V1 + VBE \quad (38)$$

$$VCE(42) = \Delta V1 - \Delta V2 + VBE \quad (39)$$

$$VCE(13) = \Delta V1 - \Delta V2 + VBE \quad (40)$$

$$VCE(23) = \Delta V2 - \Delta V3 + VBE \quad (41)$$

$$VCE(33) = \Delta V3 + VBE \quad (42)$$

$$VCE(43) = -\Delta V1 + VBE \quad (43)$$

$$VCE(14) = -\Delta V1 + VBE \quad (44)$$

$$VCE(24) = \Delta V1 - \Delta V2 + VBE \quad (45)$$

$$VCE(34) = \Delta V2 - \Delta V3 + VBE \quad (46)$$

and $$VCE(44) = \Delta V3 + VBE \quad (47)$$

In order for the circuit of FIG. 14 to be able to operate normally, the collector-emitter voltages VCE on the sixteen transistors given by the above equations (32) to (47) must all be positive. The operating conditions of this circuit thus can be expressed by inequalities $$\Delta V1 < VBE \quad (48)$$

$$\Delta V3 > -VBE \quad (49)$$

$$\Delta V1 - \Delta V2 + VBE > 0 \quad (50)$$

and $$\Delta V2 - \Delta V3 + VBE > 0 \quad (51)$$

To facilitate the understanding of the above four conditions, these conditions are rearranged using the voltage $\Delta V1$ on the point B as a parameter as follows.

(i) When $\Delta V1 = VBE$ $$\Delta V2 < 2VBE \quad (52)$$

$$\Delta V3 > -VBE \quad (53)$$

$$\Delta V2 - \Delta V3 + VBE > 0 \quad (54)$$

(ii) When $\Delta V1 = 0$ $$\Delta V2 < VBE \quad (55)$$

$$\Delta V3 > -VBE \quad (56)$$

$$\Delta V2 - \Delta V3 + VBE > 0 \quad (57)$$

(iii) When $\Delta V1 = -VBE$ $$\Delta V2 < 0 \quad (58)$$

$$\Delta V3 > -VBE \quad (59)$$

$$\Delta V2 - \Delta V3 + VBE > 0 \quad (60)$$

(iv) When $\Delta V1 = -2VBE$ $$\Delta V2 < -VBE \quad (61)$$

$$\Delta V3 > -VBE \quad (62)$$

$$\Delta V2 - \Delta V3 + VBE > 0 \quad (63)$$

(v) When $\Delta V1 = -3VBE$ $$\Delta V2 < -2VBE \quad (64)$$

$$\Delta V3 > -VBE \quad (65)$$

$$\Delta V2 - \Delta V3 + VBE > 0 \quad (66)$$

FIGS. 15A to 15E shows the operating range in the above five cases as a shaded area. In the graphs of FIGS. 15A to 15E, the ordinate is taken for $\Delta V3$, and the abscissa is taken for $\Delta V2$. One graduation in both the ordinate and abscissa axes correspond to VBE. In the case (v), the operating range is zero, that is, it marks a limit of operation. It will be from these graphs that if the voltage at the point A is set to zero, the lower limits of voltage at the points C, E and G are respectively $-3VBE$, $-2VBE$ and $-VBE$.

Figure 16:
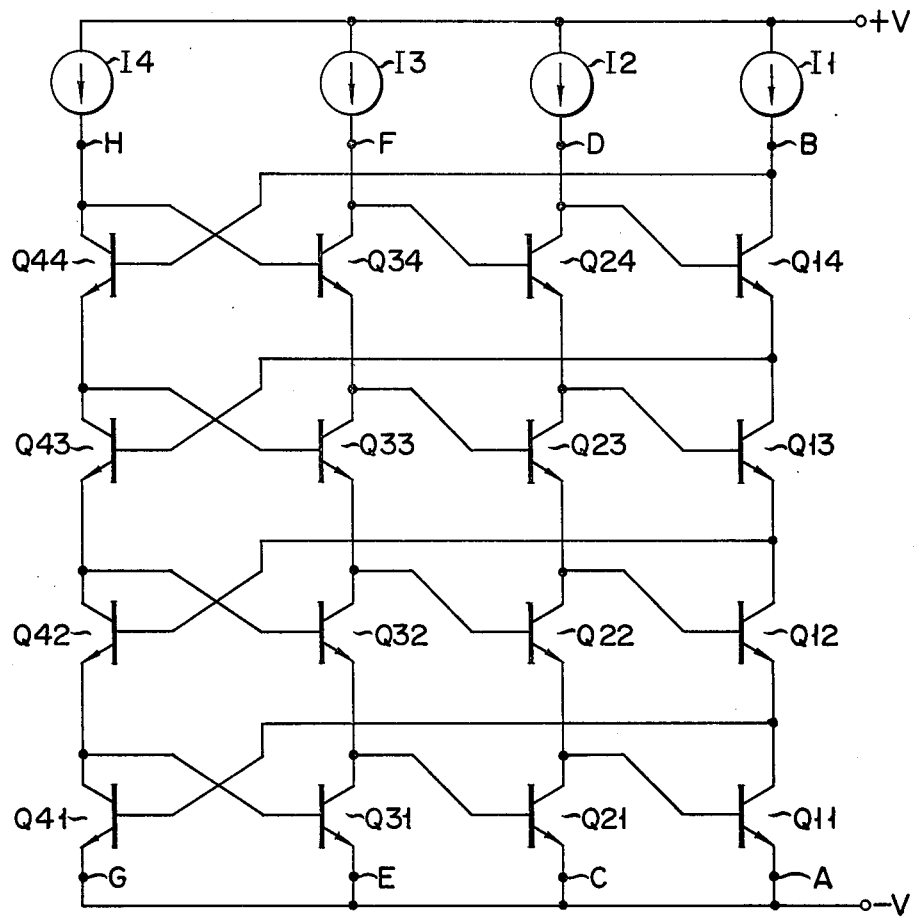
FIG. 16 is a circuit diagram showing an example of application of the seventh embodiment.

FIG. 16 shows an example of an application of the seventh embodiment. Here, the points A, C, E and G are connected to a negative voltage source terminal −V, and the points B, D, F and H are connected to a positive voltage source terminal +V through respective current sources I1, I2, I3 and I4. Denoting the emitter areas of the transistors Q11 to Q14, Q21 to Q24, Q31 to Q34 and Q41 to Q44 by A11 to A14, A21 to A24, A31 to A34 and A41 to A44 respectively, the voltages VBD, VDF, VFH and VHB between the points B and D, D and F, F and H and H and B are given as $$VBD = VT \cdot \ln \frac{A21 \cdot A32 \cdot A43 \cdot A14}{A11 \cdot A22 \cdot A33 \cdot A44} \quad (67)$$

$$VDF = VT \cdot \ln \frac{A31 \cdot A42 \cdot A13 \cdot A24}{A21 \cdot A32 \cdot A43 \cdot A14} \quad (68)$$

$$VFH = VT \cdot \ln \frac{A41 \cdot A12 \cdot A23 \cdot A34}{A31 \cdot A42 \cdot A13 \cdot A24} \quad (69)$$

and $$VHB = VT \cdot \ln \frac{A11 \cdot A22 \cdot A33 \cdot A44}{A41 \cdot A12 \cdot A23 \cdot A34} \quad (70)$$

It will be seen that the voltages VBD, VDF, VFH and VHB are independent of the currents I1 to I4 but determined by the emitter areas. If the emitter areas of the sixteen transistors are equal, the following result is obtained:

$$VBD = VDF = VFH = VHB = 0 \quad (71)$$

In this case, the voltages VB, VD, VF and VH at the points B, D, F and H are equal to 4VBE.

Like the third order transistor circuit, the fourth order transistor circuit permits various modifications, as will be described hereinafter.

Figure 17:
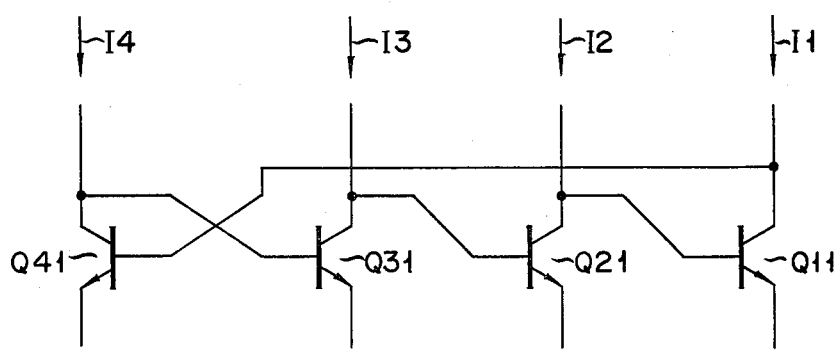
FIGS. 17 to 20 are circuit diagrams showing eighth to eleventh embodiments of the invention.

FIG. 17 shows an eighth embodiment of the invention. This embodiment corresponds to the embodiment of the third order shown in FIG. 4. This embodiment is the simplest form of the fourth order transistor circuit and consists of a single sequentially-coupled group.

Figure 18:
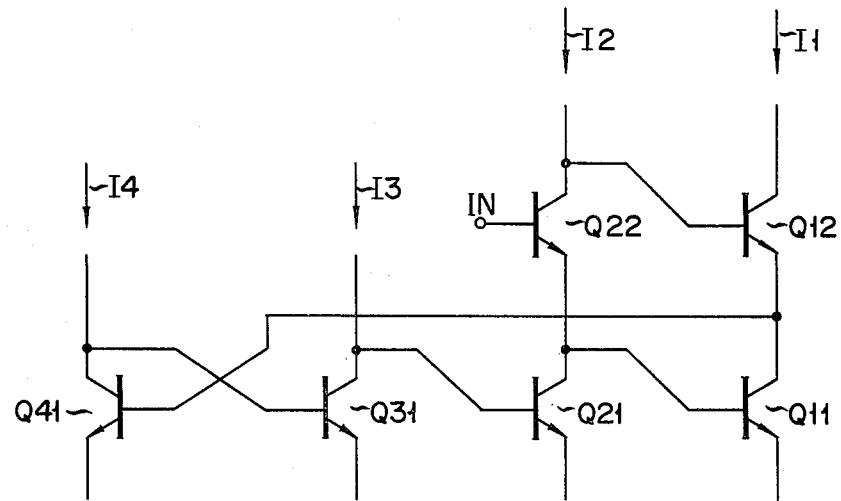

FIG. 18 shows a ninth embodiment of the invention. This embodiment corresponds to the embodiment of the third order shown in FIG. 5. This embodiment is different from the seventh embodiment of FIG. 14 in that the transistors Q13, Q14, Q23, Q24, Q32 to Q34 and Q42 to Q44 are omitted and the base of the transistor Q22 is connected to an input signal source IN.

Figure 19:
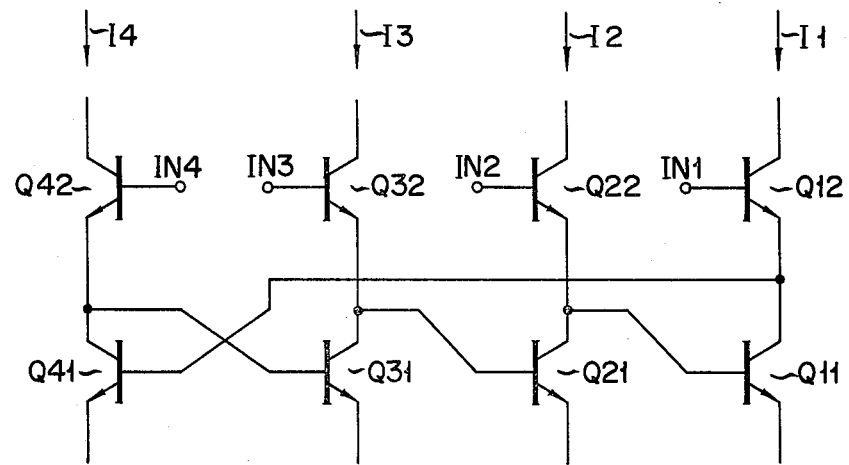

FIG. 19 shows a tenth embodiment of the invention. This embodiment corresponds to the fourth embodiment of the third order shown in FIG. 6. This embodiment is different from the seventh embodiment of FIG. 14 in that the transistors Q13, Q14, Q23, Q24, Q33, Q34, Q43 and Q44 are omitted and the bases of the transistors Q12, Q22, Q32 and Q42 are connected to respective input signal sources IN1 to IN4.

Figure 20:
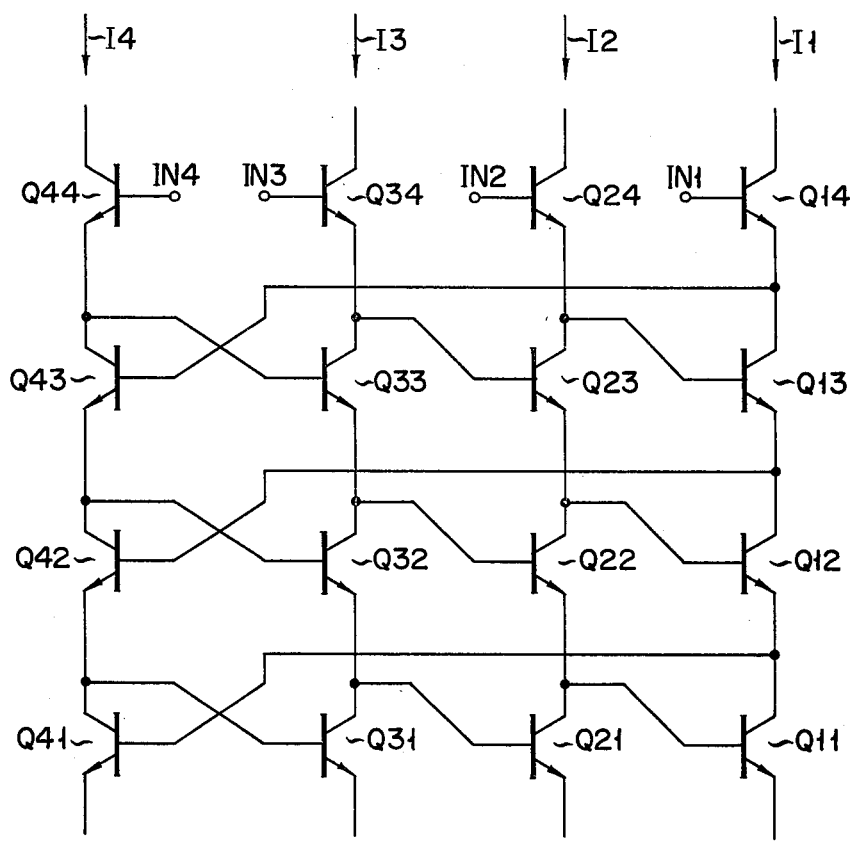

FIG. 20 shows an eleventh embodiment of the invention. This embodiment corresponds to the fifth embodiment of the third order shown in FIG. 7. This embodiment is different from the seventh embodiment of FIG. 17 in that the transistors Q14, Q24, Q34 and Q44 do not constitute a sequentially-coupled group but their bases are connected to respective input signal sources IN1, IN2, IN3 and IN4.

Figure 21:
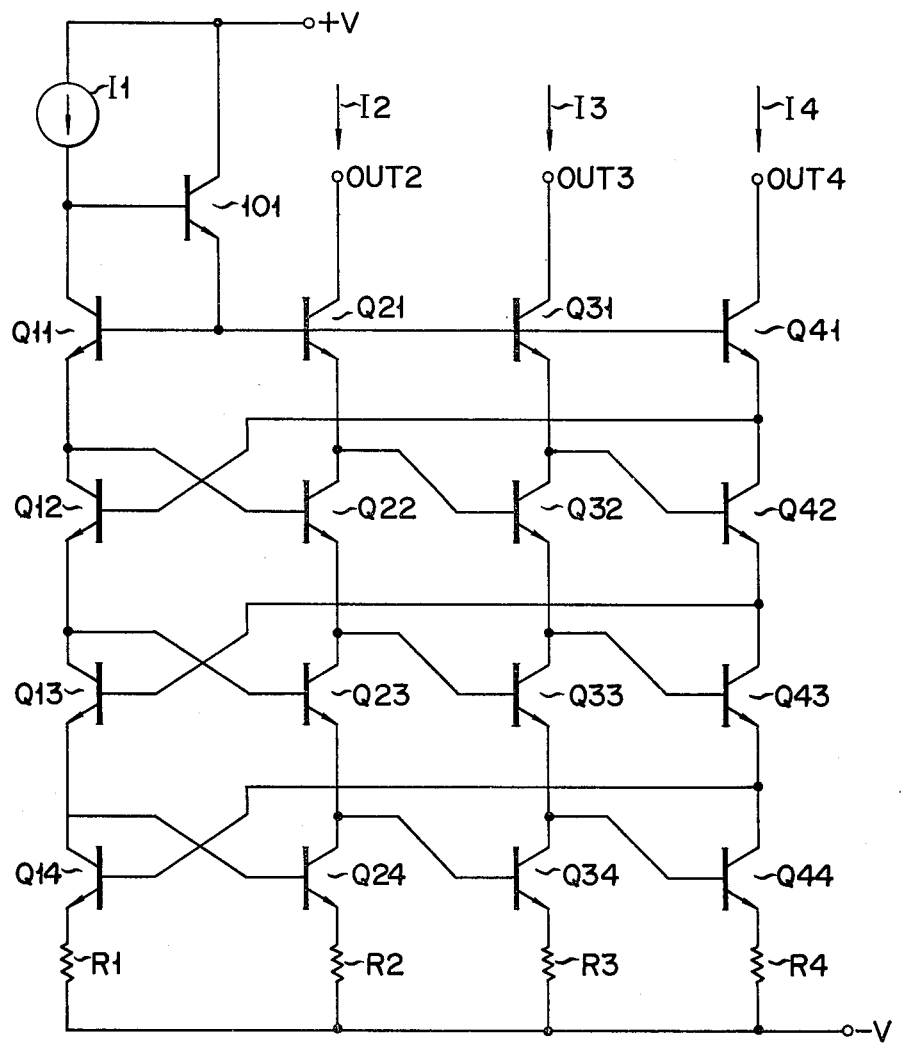
FIG. 21 is a circuit diagram showing a current source circuit as the twelfth embodiment of the invention.

FIG. 21 shows a twelfth embodiment of the invention. This embodiment is a current source circuit, which uses a fourth order transistor circuit and can provide three output currents. This circuit corresponds to the three order circuit of FIG. 9. In this twelfth embodiment, the base voltages on the transistors Q11, Q21, Q31 and Q41 are equal, so that there hold relations $$I1 \cdot R1 + VBE(14) + VBE(43) + VBE(32) + VBE(21) = \quad (72)$$

$$I2 \cdot R2 + VBE(24) + VBE(13) + VBE(42) + VBE(31) =$$

$$I3 \cdot R3 + VBE(34) + VBE(23) + VBE(12) + VBE(41) =$$

$$I4 \cdot R4 + VBE(44) + VBE(33) + VBE(22) + VBE(11)$$

Here again, if the emitter-grounded current amplification factor of all the transistors is made sufficiently large to ignore the base current into the individual transistors and regard the collector currents in the transistors in all the current paths to be equal, the following relations are obtained:

$$VBE(11) = VBE(12) = VBE(13) = VBE(14) \quad (73)$$

$$VBE(21) = VBE(22) = VBE(23) = VBE(24) \quad (74)$$

$$VBE(31) = VBE(32) = VBE(33) = VBE(34) \quad (75)$$

and $$VBE(41) = VBE(42) = VBE(43) = VBE(44) \quad (76)$$

By substituting the equations (73) to (76) into the equation (72), the following relation is obtained:

$$I1 \cdot R1 = I2 \cdot R2 = I3 \cdot R3 = I4 \cdot R4 \quad (77)$$

Thus, the three output currents I2 to I4 are given as $$I2 = \frac{R1}{R2} I1 \quad (78)$$

$$I3 = \frac{R1}{R3} I1 \quad (79)$$

and $$I4 = \frac{R1}{R4} I1 \quad (80)$$

It will be seen that with the twelfth embodiment it is possible to obtain three output currents, which are determined by the input current and the ratios of the resistance of the resistor R1 to the resistance of the resistors inserted in the current paths connected to the respective output terminals. These output currents can be readily varied by varying the resistances.

Figure 22:
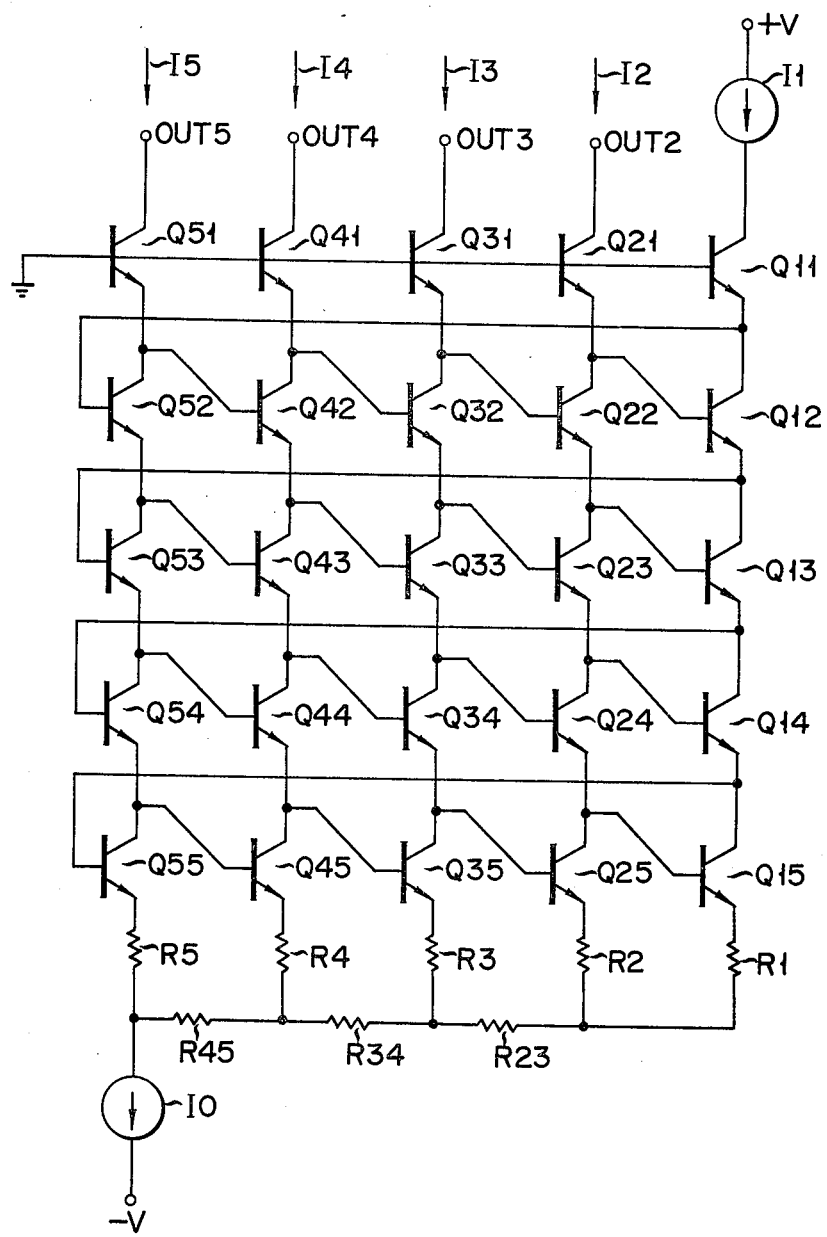
FIG. 22 is a circuit diagram showing a current source circuit as a thirteenth embodiment of the invention.

FIG. 22 shows a thirteenth embodiment of the invention which is applied to a current source circuit. This circuit is a fifth order transistor circuit, which can provide for output currents I2, I3, I4 and I5 with respective weights "1", "2", "4" and "8" from an input current I1. More particularly, this embodiment comprises five current paths and twenty-five transistors, five having the collector-emitter paths serially connected together with a series resistor to each of the current paths. In this embodiment, of the five transistors in each current path, each of four constitutes together with like position transistors in the other current paths a sequentially-coupled group. The remaining transistors have their bases grounded. One terminal of the first current path (opposite terminal to which the resistor is connected) is connected to a positive voltage source terminal +V through a current source I1. Like terminals of the second to fifth current paths are connected to respective output terminals OUT2 to OUT5. The other terminal of the first current path is connected to the other terminal of the second current path. The other terminals of the second to fourth current paths are respectively connected to the other terminals of the third to fifth current paths through respective resistors R23, R34 and R45. The other terminal of the fifth current path is connected to a negative voltage source terminal $-V$ through a current source I0.

The operation of the thirteenth embodiment will now be described. The resistance of the resistors R1 to R5 is assumed to be 2R, and the resistance of the resistors R23, R34 and R45 is assumed to be R. Using the voltage on the grounded bases of the transistors Q11, Q21, Q31, Q41 and Q51 as reference, the emitter voltages $-VE(15)$, $-VE(25)$, $-VE(35)$, $-VE(45)$ and $-VE(55)$ on the transistors Q15, Q25, Q35, Q45 and Q55 are given as $$-VE(15) = -(VBE(15) + VBE(24) + VBE(33) + VBE(42) + VBE(51)) \quad (81)$$

$$-VE(25) = -(VBE(25) + VBE(34) + VBE(43) + VBE(52) + VBE(11)) \quad (82)$$

$$-VE(35) = -(VBE(35) + VBE(44) + VBE(53) + VBE(12) + VBE(21)) \quad (83)$$

$$-VE(45) = -(VBE(45) + VBE(54) + VBE(13) + VBE(22) + VBE(31)) \quad (84)$$

and $$-VE(55) = -(VBE(55) + VBE(14) + VBE(23) + VBE(32) + VBE(41)) \quad (85)$$

Again in this embodiment, if the emitter-grounded current amplification factor of the individual transistors is sufficiently large, there hold relations $$VBE(11) = VBE(12) = VBE(13) = VBE(14) = VBE(15) \quad (86)$$

$$VBE(21) = VBE(22) = VBE(23) = VBE(24) = VBE(25) \quad (87)$$

$$VBE(31) = VBE(32) = VBE(33) = VBE(34) = VBE(35) \quad (88)$$

$$VBE(41) = VBE(42) = VBE(43) = VBE(44) = VBE(45) \quad (89)$$

and $$VBE(51) = VBE(52) = VBE(53) = VBE(54) = VBE(55) \quad (90)$$

Substituting the equations (86) to (90) into the equations (81) to (85), the following relation is obtained:

$$-VE(15) = -VE(25) = -VE(35) = -VE(45) = -VE(55) \quad (91)$$

It will be seen that in the circuit of FIG. 22 the emitter voltages on the transistors Q15 to Q55 are equal. The emitter voltages on the transistors Q15 to Q55 are given as follows:

$$I1 \cdot R1 = I2 \cdot R2 \quad (92)$$

$$I3 \cdot R3 = I2 \cdot R2 + (I1 + I2) \cdot R23 \quad (93)$$

$$I4 \cdot R4 = I3 \cdot R3 + (I1 + I2 + I3) \cdot R34 \quad (94)$$

$$I5 \cdot R5 = I4 \cdot R4 + (I1 + I2 + I3 + I4) \cdot R45 \quad (95)$$

$$I0 = I1 + I2 + I3 + I4 + I5 \quad (96)$$

Substituting $R1 = R2 = R3 = R4 = R5 = 2R$ and $R23 = R34 = R45 = R$ into the equations (92) to (96), the output currents I2 to I5 are given as follows:

$$I2 = \frac{1}{16} I0 \quad (97)$$

$$I3 = \frac{1}{8} I0 \quad (98)$$

$$I4 = \frac{1}{4} I0 \quad (99)$$

$$I5 = \frac{1}{2} I0 \quad (100)$$

It will be seen that with the resistance set in the above way, the output currents I2 to I5 with the respective weights of "1", "2", "4" and "8" can be obtained from the four output terminals OUT2 to OUT5 respectively.

Figure 23:
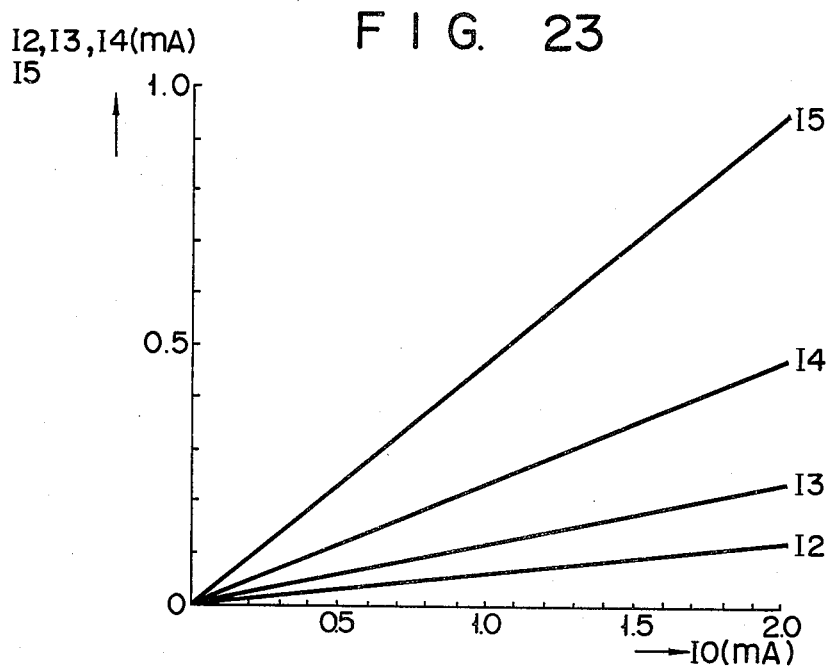
FIGS. 23 and 24 are graphs showing the characteristics of the circuit of the thirteenth embodiment.
Figure 24:
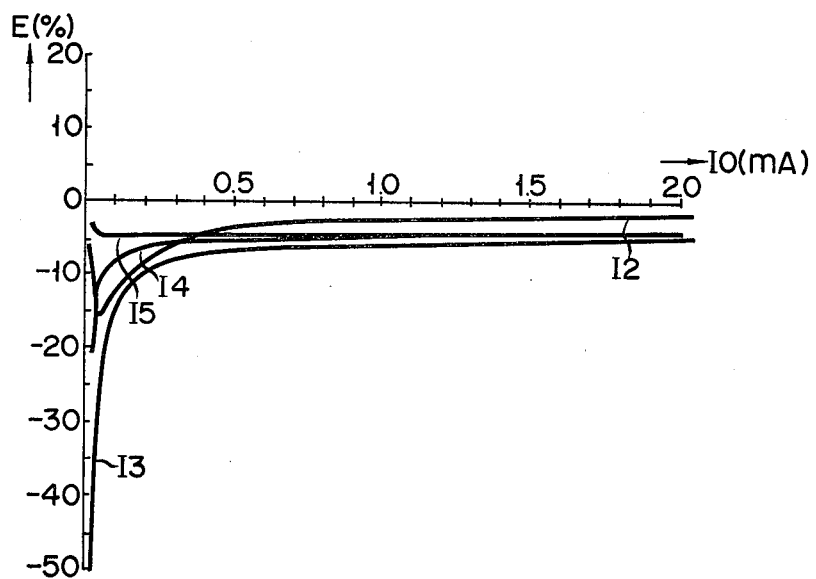

The results of experiments conducted by setting the resistances of the resistors R1 to R5 in the circuit of FIG. 22 to 4kΩ and the resistance of the resistors R23, R34 and R45 to 2kΩ will now be discussed. FIG. 23 shows the output currents I2 to I5 plotted against the value of the current source I0, and FIG. 24 shows the percentage error voltages in this case. It will be seen from FIG. 24 that the percentage errors can be within 5% if the current I0 is sufficiently large. This order of error is sufficient with a 4-bit current source. Thus, a high precision converter can be constructed using the circuit of FIG. 22.

The transistor circuit according to the invention may be not only of the third, fourth or fifth order, but also may be of any further higher order. A general N-th order (N being any positive integer) embodiment will now be described.

Figure 25:
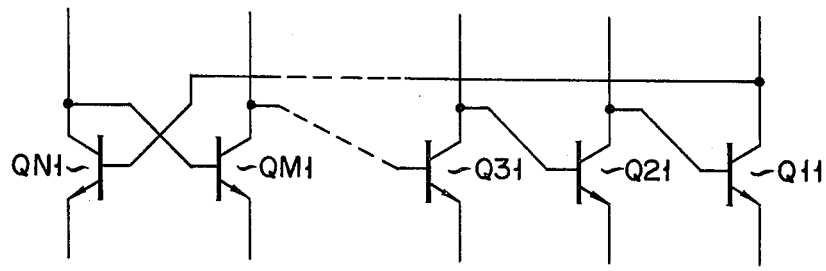
FIGS. 25 to 28 are circuit diagrams showing fourteenth to seventeenth embodiments of the invention.

FIG. 25 shows a fourteenth embodiment of the invention, which is the simplest N-th order transistor circuit. The circuit comprises N transistors Q11 to QN1 which constitute a sequentially-coupled group. The base of the transistors Q11 to QM1 (M=N−1) is connected to the collector of the respective transistors Q21 to QN1, and the base of the transistor QN1 is connected to the collector of the transistor Q11.

Figure 26:
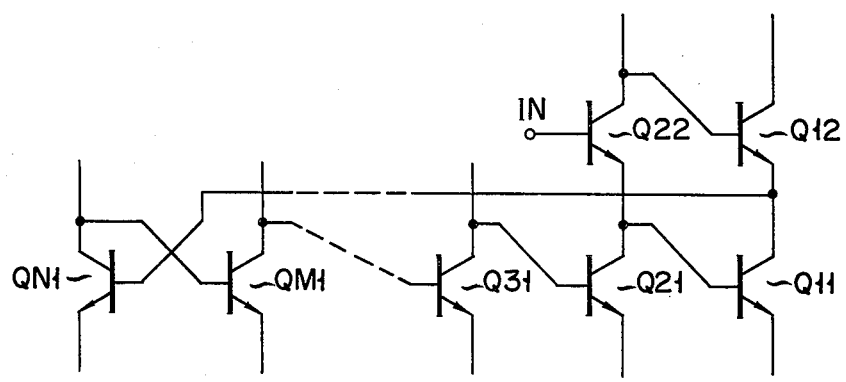

FIG. 26 shows a fifteenth embodiment, which corresponds to the third embodiment of the third order shown in FIG. 5 and also to the ninth embodiment of the fourth order shown in FIG. 18. This embodiment further comprises transistors Q12 and Q22 connected in series with the respective transistors Q11 and Q21 in the fourteenth embodiment of FIG. 25. The bases of the transistors Q12 and Q22 are connected to the collector of the transistor Q22 and to an input signal source IN respectively.

Figure 27:
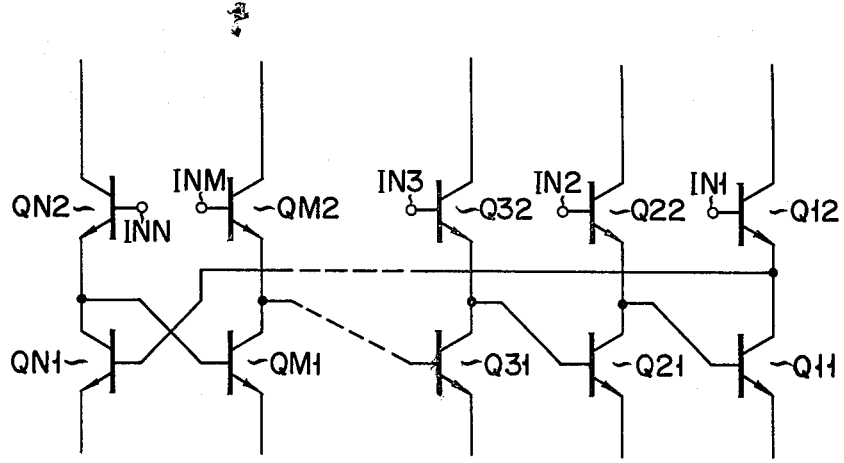

FIG. 27 shows a sixteenth embodiment, which corresponds to the fourth embodiment of the third order shown in FIG. 6 and also to the tenth embodiment of the fourth order shown in FIG. 19. In this embodiment, transistors Q12 to QN2 are connected to respective transistors Q11 to QN1 which constitute a sequentially-coupled group. The bases of the transistors Q12 to QN2 are connected to respective input signal sources IN1 to INN.

Figure 28:
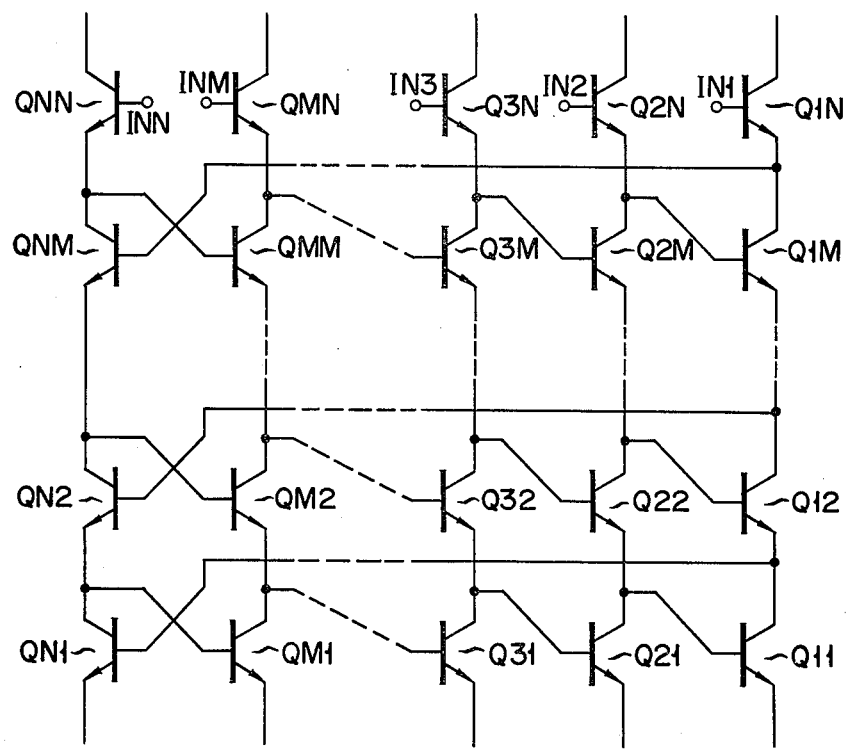

FIG. 28 shows a seventeenth embodiment, which corresponds to the fifth embodiment of the third order shown in FIG. 7 and also to the eleventh embodiment of the fourth order shown in FIG. 20. Here, the collector-emitter paths of N transistors corresponding in number to the order number are serially connected in each of the current paths. M transistors in each current path form, together with the like position transistors in the other current paths, a sequentially-coupled group. The remaining transistors in the individual current paths have their bases connected to respective input signal sources IN1 to INN.

Although not shown, the N-th order transistor circuits described above may be used to construct corresponding current source circuits.

Further, in the description above, the transistors are all assumed to be npn type transistors; it is possible to use pnp type transistors by reversing the polarities of the voltage source and the directions of the currents. That is, while the current source circuits described above have dealt with sink current, it is possible to handle push current if pnp transistors are used.

As has been described in the foregoing, according to the invention it is possible to provide a transistor circuit, which comprises a desired number of current paths and in which the voltages between the opposite terminals of the individual current paths can be set to a desired value irrespective of currents through the current paths, so that this invention can be applied to voltage follower circuits, level shift circuits, small signal circuits, current source circuits and various other circuits.

What is claimed is:

1. A transistor circuit comprising:
   at least three current paths; and
   sequentially-coupled transistor means including N transistors (N being the number of said current paths) with the collector-emitter paths thereof connected in series with said respective current paths, the base of an i-th transistor (i being a positive integer from 1 to N−1) being connected to the collector of the (i+1)-th transistor, the base of the N-th transistor being connected to the collector of the first transistor.

2. A transistor circuit according to claim 1, wherein said sequentially-coupled transistor means includes M×N transistors (M being a positive integer no less than 2) with the collector-emitter paths of M transistors being connected in series in each of said current paths, the transistors in all said current paths being connected such that the base of a transistor in the i-th current path is connected to the collector of the like position transistor in the (i+1)-th current path and that the base of a transistor in the N-th current path is connected to the collector of the like position transistor in the first current path.

3. A transistor circuit according to claim 1 or 2, which further comprises a first transistor with the collector-emitter path thereof connected in series with one of said current paths, a second transistor with the collector-emitter path thereof connected in series with a different one of said current paths and the collector thereof connected to the base of said first transistor, and an input signal source connected to the base of said second transistor.

4. A transistor circuit according to claim 1 or 2, which further comprises N input transistors with the collector-emitter paths thereof connected in series with said respective current paths, and N input signal sources connected to the bases of said respective N input transistors.

5. A transistor circuit according to claim 1 or 2, wherein the transistors constituting said transistor means are of the same conductivity type and have an equal emitter area.

6. A current source circuit comprising:
   an input current source;
   at least two output terminals;
   at least three current paths respectively connected at one terminal to said input current source and said output terminals through a current mirror circuit;
   sequentially-coupled transistor means including N×M transistors (N being the number of said current paths, M being a positive integer no less than 2) with M transistors being connected in series in each of said current paths, the base of a transistor in the i-th current path (i being a positive integer from 1 to N−1) being connected to the collector of the like position transistor in the (i+1)-th current path, the base of a transistor in the N-th current path being connected to the like position transistor in the first current path; and
   N transistors connected between the other terminals of said current paths and a reference voltage terminal.

7. A current source circuit according to claim 6, which further comprises a first transistor with the collector-emitter path thereof connected in series with one of said current paths, a second transistor with the collector-emitter path thereof connected in series with a different one of said current paths and the collector thereof connected to the base of said first transistor, and an input signal source connected to the base of said second transistor.

8. A current source circuit according to claim 6, which further comprises N input transistors with the collector-emitter paths thereof connected in series with said respective current paths, and N input signal sources connected to the bases of said respective N input transistors.

9. A current source circuit according to claim 6, wherein the transistors constituting said transistor means are of the same conductivity type and have an equal emitter area.

10. A current source circuit according to claim 6, wherein said current mirror circuit includes N transistors whose collector-emitter paths being connected between said input current source and said output terminals, said N transistors having the bases commonly connected, the common junction being connected to said input current source.

11. A current source circuit according to claim 10, wherein said common junction of the bases of said N transistors is connected to said input current source through the base-emitter path of a third transistor.

* * * * *